United States Patent
Koizumi et al.

(10) Patent No.: US 7,453,109 B2
(45) Date of Patent: Nov. 18, 2008

(54) SOLID-STATE IMAGE SENSOR AND IMAGING SYSTEM

(75) Inventors: Toru Koizumi, Yokohama (JP); Akira Okita, Yamato (JP); Tetsuya Itano, Zama (JP); Sakae Hashimoto, Sagamihara (JP); Ryuichi Mishima, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/219,007

(22) Filed: Sep. 1, 2005

(65) Prior Publication Data

US 2006/0049476 A1    Mar. 9, 2006

(30) Foreign Application Priority Data

Sep. 3, 2004 (JP) ............................. 2004-257254
Nov. 29, 2004 (JP) ............................. 2004-343357

(51) Int. Cl.
*H01L 31/062* (2006.01)
(52) U.S. Cl. .................................... 257/291; 257/437
(58) Field of Classification Search ............. 257/291, 257/292, 294, 432, 436, 437
See application file for complete search history.

(56) References Cited

U.S. PATENT DOCUMENTS

| 6,221,687 | B1 | 4/2001 | Abramovich |
| 6,344,670 | B2 * | 2/2002 | Yamaguchi et al. ......... 257/292 |
| 6,614,479 | B1 | 9/2003 | Fukusho et al. |
| 6,635,912 | B2 * | 10/2003 | Ohkubo ..................... 257/292 |
| 2001/0023086 | A1 | 9/2001 | Park |
| 2001/0054677 | A1 | 12/2001 | Nakashima |
| 2001/0054743 | A1 | 12/2001 | Ueno |

FOREIGN PATENT DOCUMENTS

| JP | 10-256518 A | 9/1998 |
| JP | 11-103037 A | 4/1999 |
| JP | 2000-252451 A1 | 9/2000 |
| JP | 2001-015724 A1 | 1/2001 |
| JP | 2001-267547 A | 9/2001 |
| JP | 2001-284566 A | 10/2001 |

* cited by examiner

*Primary Examiner*—Mark Prenty
(74) *Attorney, Agent, or Firm*—Canon USA Inc IP Division (57) ABSTRACT

At least one exemplary embodiment is directed to a solid state image sensor including at least one antireflective layer and/or non rectangular shaped wiring layer cross section to reduce dark currents and 1/f noise.

20 Claims, 7 Drawing Sheets

SOLID-STATE IMAGE SENSOR AND IMAGING SYSTEM

BACKGROUND OF THE INVENTION

1. Field of the Invention

The present invention relates to solid-state image sensors and imaging systems and particularly, though not exclusively, relates to a solid-state image sensor including a plurality of wiring layers and an imaging system including such a solid-state image sensor.

2. Description of the Related Art

Great improvements due to microfabrication have been made in current amplifier-type solid-state image sensors (hereinafter referred to as CMOS image sensors) manufactured by CMOS technology. In order to enhance properties of such CMOS image sensors, attempts below have been being made.

In a CMOS image sensor, a logic process is usually used causing system heating, which in turn releases thermal photons which trigger a "dark" current in the CMOS sensor. Several conventional methods make a first attempt to reduce the effect of dark currents. A second attempt is to reduce noise, for example, 1/f noise, caused by amplifying circuits including CMOS transistors.

The dark current and the 1/f noise can be reduced by hydrotreating substrates having light-receiving sections arranged thereon. The most effective technique is to heat-treat stacked layers containing a large amount of hydrogen. Examples of such hydrogen-containing layers include silicon nitride layers (plasma SiN layers) formed by a plasma-enhanced CVD process. Such a technique is usually used to manufacture a conventional CCD as discussed in U.S. Patent Application Publication No. 2001/054743 (Japanese Patent Laid-Open No. 10-256518). A hydrotreating process is used to prepare a CMOS image sensor as discussed in U.S. Patent Application Publication No. 2001/023086 (Japanese Patent Laid-Open No. 2001-267547). The use of such a hydrotreating process to prepare CMOS image sensors can cause several problems due to a difference in flatness between interlayer films. Such a difference will now be briefly described.

Conventional CMOS image sensors each include at least two wiring layers. In order to micromachine the wiring layers, a planarization technique, for example, chemical mechanical polishing (CMP), can be used. However, the wiring layers treated by the planarization technique are flat when observed on a microscopic level (several to several tens of micrometers) but are partly nonuniform in thickness when observed on a macroscopic level (several to several tens of millimeters).

The thickness of an interlayer insulating layer polished by the CMP process varies depending on the number of CMOS transistors arranged in a unit area. That is, when the interlayer insulating layer has a peripheral circuit section having the CMOS transistors densely arranged and a pixel section having the CMOS transistors sparsely arranged, the peripheral circuit section has a thickness different from that of the pixel section. The thickness of a third section between these sections gradually varies; hence, the thickness of an effective pixel region also varies. Even if an etchback process is used, a difference in layer thickness is caused because the planar dependency of an apparatus is large.

The following problem is described below in detail: a problem arising from a CMOS image sensor including stacked plasma SiN layers, treated with hydrogen, containing a large amount of hydrogen.

The difference in color between areas can be problematic. That is, when a uniform, bright white surface is monitored, an obtained image has slightly green areas and slightly red areas. This phenomenon is principally caused by the interference between two light beams: a light beam reflected from the interface between a light-receiving face of a substrate and an interlayer insulating layer placed on the light-receiving face and another light beam reflected from the interface between a plasma SiN layer and the interlayer insulating layer. The mechanism of the phenomenon is described below in detail with reference to FIG. 8.

Figure 8:
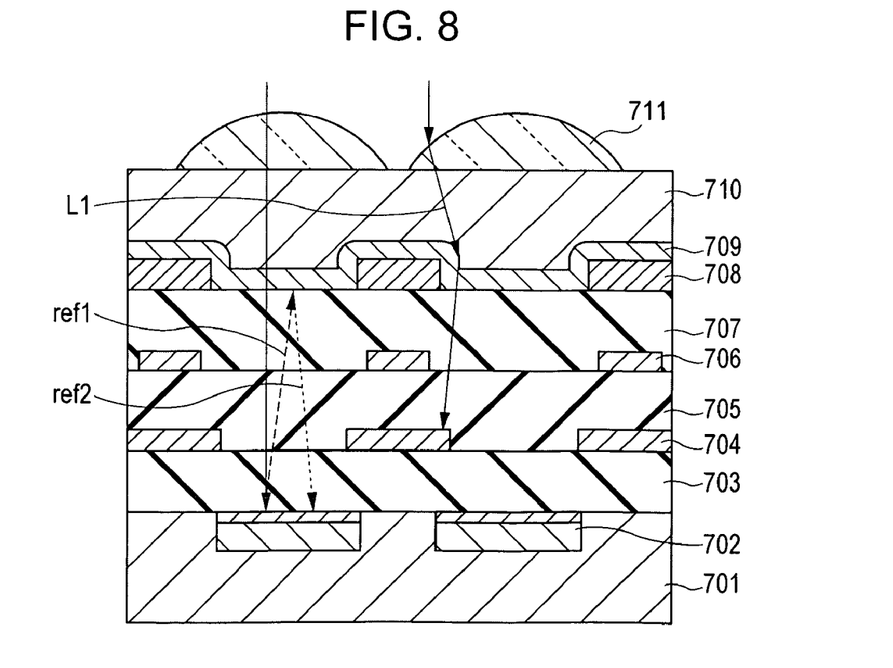
FIG. 8 illustrates a schematic sectional view showing a conventional CMOS image sensor.

FIG. 8 illustrates a schematic sectional view showing a conventional CMOS image sensor. This CMOS image sensor includes a silicon substrate 701, embedded photodiodes 702 for receiving light, a first interlayer insulating layer 703, a first wiring layer 704, a second interlayer insulating layer 705, a second wiring layer 706, a third interlayer insulating layer 707, a third wiring layer 708, a plasma SiN layer 709 acting as a passivation layer for reducing the dark current, a color filter 710, and microlenses 711, these components being arranged in that order. The silicon substrate 701 has a refractive index of 3.5 to 5.2. The first, second, and third interlayer insulating layers 703, 705, and 707 are made of $SiO_2$ and have a refractive index of 1.4 to 1.5. The plasma SiN layer 709 has a refractive index of 2.0. The color filter 710 has a refractive index of 1.58. The microlenses 711 have a refractive index of 1.58.

In the CMOS image sensor, light is reflected from the interface between the silicon substrate 701 and the first interlayer insulating layer 703 and the interface between the third interlayer insulating layer 707 and the plasma SiN layer 709; hence, a first reflected light beam ref1 and a second reflected light beam ref2 cause interference as shown in FIG. 8. In particular, light beams with a long wavelength cause serious interference, thereby causing serious ripples (interference). If these layers have a uniform thickness, the problem is reduced. However, these layers have a nonuniform thickness when observed on a macroscopic level as described above; hence, the positions of the ripples are shifted. This leads to the occurrence of color inconsistency, thereby causing a further problem.

A cause of this problem is that the plasma SiN layer 709 has a refractive index greater than those of other layers. Another cause of this problem is that the thickness of the first, second, and third interlayer insulating layers 703, 705, and 707 is large, 3 to 5 μm; hence, these layers planarized by CMP have a nonuniform thickness. Thus, the inclusion of SiN passivation layers are not problematic in solid-state image sensors (e.g., CCDs), which include thin interlayer insulating layers that are not planarized. The color inconsistency is a problem for the CMOS image sensor because the first, second, and third interlayer insulating layers 703, 705, and 707 are planarized. This can be explained using the equation $2 \times L \times n_{sio} = k\lambda$, wherein L represents the thickness of an interlayer insulating layer, k represents an integer, and λ represents the resonant wavelength of light. When L is equal to 3.5 μm, λ is 609 or 576 nm if k is equal to 17 or 18, respectively. When L is equal to 1.0 μm, λ is 592 or 493 nm if k is equal to 5 or 6, respectively. Therefore, the ripples are smaller. If the thickness of each interlayer insulating layer is reduced (e.g., from 3.5 to 1.0 μm), the amplitude of the ripples is reduced to about one third because the spectral characteristics of the CMOS image sensor are smoothed.

Figure 9:
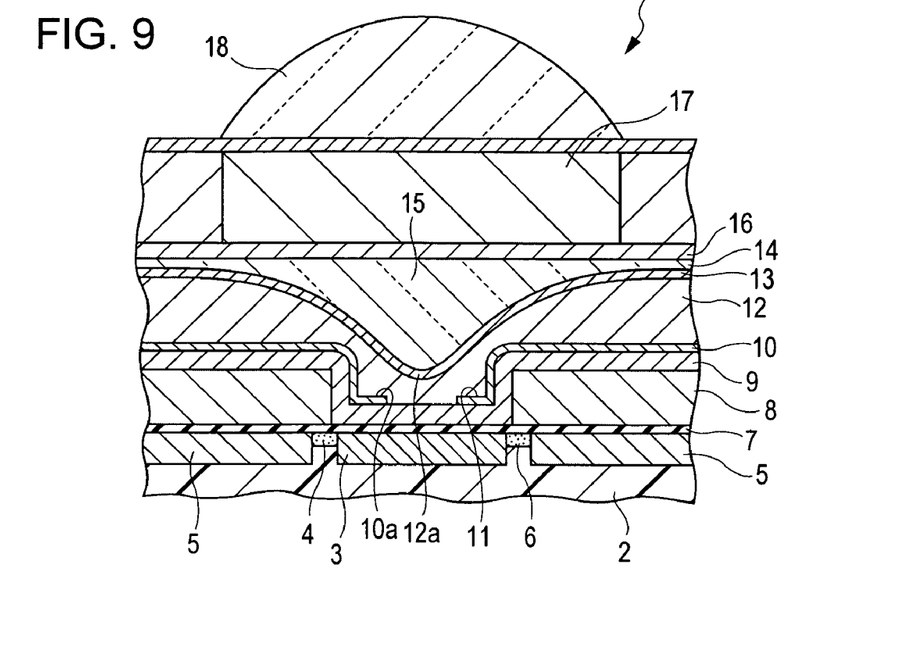
FIG. 9 is an illustration showing anti-reflective layers each placed on or under an in-layer lens included in a conventional CCD.

In order to reduce the above effects, anti-reflective layers that can be used for in-layer lenses for CCDs may be used. U.S. Pat. No. 6,614,479 (Japanese Patent Laid-Open No. 11-103037), which is hereinafter referred to as Patent Document 1, discusses anti-reflective layers. FIG. 9 is an illustration showing a conventional CCD. The CCD includes SiON anti-reflective layers having a refractive index of 1.7 to 1.9 and a SiN layer, placed therebetween, having in-layer lenses; hence, no interface reflecting light is present between the SiN layer and an interlayer insulating layer.

According to this technique, the amount of reflected light can be reduced by 30%. Although the amplitude of ripples is reduced, small ripples appear in short-wavelength regions. A large number of steps are used to prepare a structure including the in-layer lenses discussed in Patent Document 1; hence, the manufacturing cost of a solid-state image sensor having such a structure is high.

U.S. Patent Application Publication No. 2001/054677 (Japanese Patent Laid-Open No. 2001-284566), which is hereinafter referred to as Patent Document 2, discusses a passivation layer having high humidity resistance, high chemical resistance, and barrier properties against metal and impurities (e.g., Na ions and oxygen). The passivation layer is made of SiN, overlies the uppermost wiring layer, and has a refractive index different from that of conventional interlayer insulating layers.

In this configuration, ripples are caused by light rays reflected from the interface between the passivation layer and an interlayer insulating layer and light rays reflected from the surfaces of light-receiving sections. However, Patent Document 2 discusses no technique for solving this problem.

Since the passivation layer has steps, incident light is refracted in an unexpected direction. In order to cope with such a problem, Patent Document 2 discusses another structure including a planarized passivation layer. However, Patent Document 2 discusses no technique for coping with the ripples. Therefore, color inconsistency is an issue in this structure.

SUMMARY OF THE INVENTION

An exemplary embodiment relates to a solid-state image sensor including a substrate, light-receiving sections placed on the substrate, a plurality of wiring layers, a plurality of interlayer insulating layers, and a first insulating layer. The wiring layers and the interlayer insulating layers are alternately arranged on the substrate. In at least one exemplary embodiment, at least one of the wiring layers is placed on the first insulating layer. The solid-state image sensor can further include a second insulating layer which can be placed on the wiring layer. The wiring layer can be placed on the first insulating layer, and the second insulating layer can have portions in contact with the first insulating layer, the portions being located at the positions corresponding to the light-receiving sections, and which have a refractive index different from that of the first insulating layer. Additionally a third insulating layer can be placed above the light-receiving sections, which reduces reflected light from the interface between the substrate and the interlayer insulating layer placed on the substrate.

Another exemplary embodiment further relates to a solid-state image sensor including a substrate, light-receiving sections placed on the substrate, a plurality of wiring layers, a plurality of interlayer insulating layers, and a substantially flat first insulating layer. The wiring layers and the interlayer insulating layers can be alternately arranged on the light-receiving sections. At least one of the wiring layers can be placed on the first insulating layer. The solid-state image sensor can further include a silicon oxide layer, a silicon nitride layer, and a silicon oxynitride layer. For example, in at least one exemplary embodiment, the silicon oxide layer and the silicon nitride layer are placed above the light-receiving sections in that order, the silicon nitride layer is placed on the wiring layer on the first insulating layer and has portions in contact with the first insulating layer with the silicon oxynitride layer placed between therebetween, and the contact portions correspond to the light-receiving sections.

Yet another exemplary embodiment further related to an imaging system includes any one of the above solid-state image sensors, an optical system for transmitting light to the sensor, and a signal-processing circuit for processing a signal transmitted from the sensor.

According to at least one exemplary embodiment, ripples caused by the following beams can be reduced: a light beam reflected from the interface between an interlayer insulating layer placed on a wiring layer and an insulating layer having a refractive index different from that of the interlayer insulating layer and a light beam reflected from the surfaces of light-receiving sections, reducing color inconsistency.

Further features of the present invention will become apparent from the following description of exemplary embodiments with reference to the attached drawings.

The accompanying drawings, which are incorporated in and constitute a part of the specification, illustrate exemplary embodiments of the present invention.

DESCRIPTION OF THE EMBODIMENTS

The following description of exemplary embodiment(s) is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate. For example, member formation and manufacturing may not be discussed in detail, however such processes as known by one of ordinary skill in the art and equivalent methods, processes, and materials would fall within the intended scope of exemplary embodiments. For example, materials, temperatures of formation, sizes of layers, and time increments for steps may be discussed, however other materials, times, temperatures, and sizes are meant to lie within the scope of exemplary embodiments.

Additionally exemplary embodiments are not limited to CMOS systems but can be used for any optical system (e.g., optical lens units, and CCDs) that have a need for noise, reflection suppression, and/or dark current reduction.

Notice that similar reference numerals and letters refer to similar items in the following figures, and thus once an item is defined in one figure, it may not be discussed for following figures.

First Exemplary Embodiment

Figure 1:
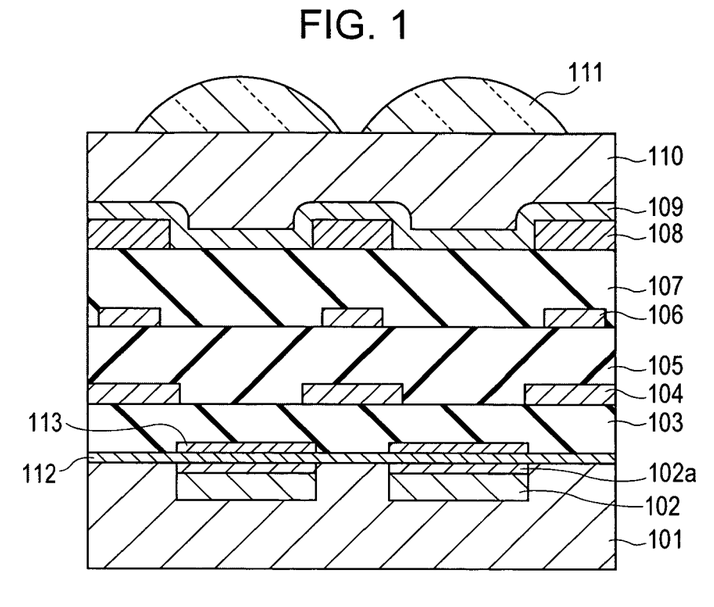
FIG. 1 illustrates a sectional view showing a solid-state image sensor according to a first exemplary embodiment.

A solid-state image sensor according to a first exemplary embodiment will now be described. FIG. 1 illustrates a sectional view showing the solid-state image sensor. The solid-state image sensor can include a substrate 101 (e.g., Si), light-receiving sections 102 each including corresponding embedded photodiodes, a first interlayer insulating layer 103, a first wiring layer 104, a second interlayer insulating layer 105, a second wiring layer 106, a third interlayer insulating layer 107 (or first insulating layer), a third wiring layer 108, a layer 109 (e.g., plasma SiN) for supplying hydrogen to reduce the dark current, a color filter 110, and microlenses 111. Since the layer 109 functions as a passivation layer, the layer 109 can lie over the silicon substrate 101.

The solid-state image sensor further includes an anti-reflective structure 102a, placed on the light-receiving sections 102, including portions having different refractive indexes. The anti-reflective structure is used to reduce color inconsistency and avoid a reduction in sensitivity which are inherent in conventional solid-state image sensors. That is, the anti-reflective structure reduces reflected light from the surfaces of the light-receiving sections 102. In order to reduce the dark current and 1/f noise, the plasma SiN layer 109 can contain a large amount of hydrogen and the content of hydrogen in the plasma SiN layer 109 is preferably greater than that of hydrogen in the interlayer insulating layers.

Figure 2:
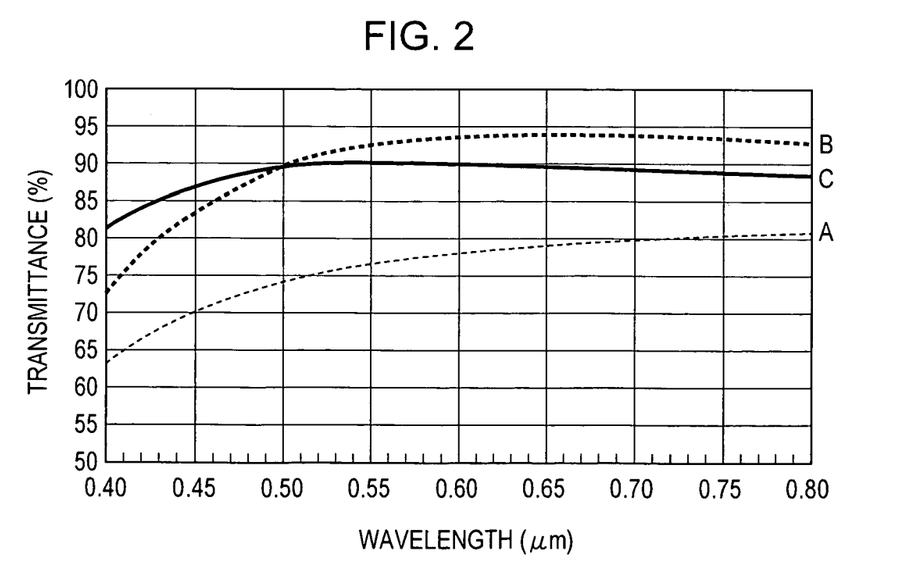
FIG. 2 illustrates a graph showing the transmittance of solid-state image sensors including anti-reflective structures placed on light-receiving sections or including no anti-reflective structure.

As shown in FIG. 1, the anti-reflective structure includes a layer 112 (e.g., SiO$_2$) and layer 113 (e.g., SiN). With reference to FIG. 2, Line B indicates the transmittance of the solid-state image sensor in which the layer 112 has a thickness of about 2.5 nm and the layer 113 have a thickness of about 70 nm and Line A indicates the transmittance of a conventional solid-state image sensor including no anti-reflective structure.

The amount of light reaching a silicon substrate included in the conventional solid-state image sensor is equal to 78% of the amount of incident light with a wavelength of 600 nm. This means that the amount of reflected light is equal to 22% of the amount of the incident light. On the other hand, in the solid-state image sensor of at least one exemplary embodiment the amount of reflected light is equal to about 6% of the amount of incident light. That is, the amount of the reflected light of the solid-state image sensor is equal to 0.27 of that of the conventional solid-state image sensor as calculated as follows: 6%/22%=0.27. Therefore, the amplitude of ripples caused by reflected light beams of the solid-state image sensor is equal to about one third or less of that of the conventional solid-state image sensor.

At least one exemplary embodiment includes a first CMOS image sensor including a first anti-reflective structure placed on light-receiving section. Yet a second exemplary embodiment includes a second CMOS image sensor including a second anti-reflective structure placed above or below a second plasma SiN layer. In the first CMOS image sensor, the light-receiving sections, the first anti-reflective structure, and a first plasma SiN layer containing a large amount of hydrogen are arranged. This arrangement, which is different from that of components included in a CCD, facilitates coping with problems inherent in CMOS image sensors. Thus, this arrangement is also suitable for CMOS image sensors. The term "anti-reflective structure" is herein defined as a structure, placed between two layers or components, for reducing the reflection of incident light from the interface between the layers or components.

Another type of solid-state image sensor, in accordance with at least one exemplary embodiment, includes an additional anti-reflective structure placed under a plasma SiN layer acting as a passivation layer. This structure is effective in reducing color inconsistency. The amplitude of ripples of this solid-state image sensor is about one fifth or less of that of the former solid-state image sensor including no additional anti-reflective structure.

Figure 3:
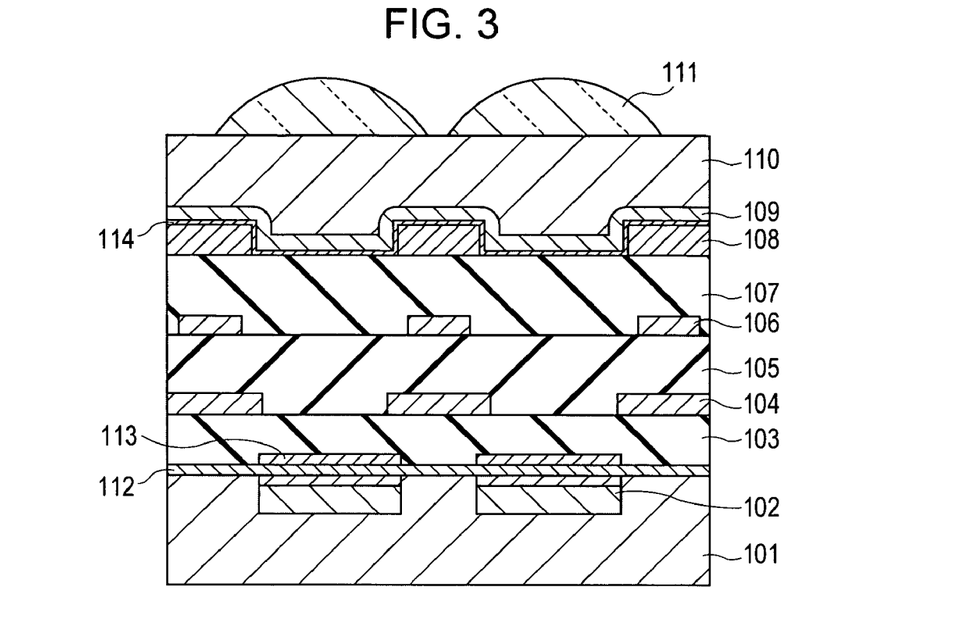
FIG. 3 illustrates a sectional view showing another type of solid-state image sensor.

FIG. 3 illustrates a configuration of this solid-state image sensor. In order to simplify the description, the same components shown in FIGS. 1 and 3 have the same reference numerals. Reference numeral 114 represents the additional anti-reflective structure. The additional anti-reflective structure 114 includes a SiON layer, or other suitable layer as would be known by one of ordinary skill in the relevant art, which is placed between a plasma SiN layer 109 and a third interlayer insulating layer 107 and has a refractive index that is between the refractive index of the plasma SiN layer 109 and the refractive index of the third interlayer insulating layer 107. The additional anti-reflective structure 114 has a configuration different from that of an anti-reflective structure placed on light-receiving sections 102. The SiON layer has a thickness of about 100 nm and the plasma SiN layer 109 has a thickness of about 400 nm. Light beams with a wavelength of 500 to 600 nm cause ripples. In order to reduce the reflection of such light beams, the SiON layer can have a thickness of 100, 300, or 500 nm. In order to reduce the ripples, that is, in order to reduce color inconsistency, in at least one exemplary embodiment the thickness of the SiON layer can be increased (e.g., 300 nm). However, in yet another exemplary embodiment where consideration of the refraction of light described above may be an important design criteria, the thickness of the SiON layer can be lower (e.g., ably 100 nm).

When a SiO$_2$ layer 112, included in the anti-reflective structure placed on the light-receiving sections 102, has a thickness of 6 nm and additional SiN layers 113, included therein, have a thickness of 45 nm, the reflectance of light with a wavelength of 600 nm is about 10%. Since the additional anti-reflective structure 114 is placed under the plasma SiN layer 109, the degree of color inconsistency of this solid-state image sensor is about one third of that of the former solid-state image sensor including no additional anti-reflective structure. With reference to FIG. 2, Line C indicates the transmittance of this solid-state image sensor. If a photoelectric conversion apparatus includes this solid-state image sensor, the apparatus will have a high sensitivity to incident light with a wavelength of about 500 nm or less. In this solid-state image sensor, the distance between microlenses 111 and the light-receiving sections 102 can be larger than the distance between conventional microlenses and light-receiving sections. In order to prevent the light gathering ability of the microlenses 111 from being reduced, the SiON layer preferably can have a thickness less than that of the uppermost wiring layer (a light-shielding layer). For example, in at least one exemplary embodiment, the SiON layer can have a thickness of about 100 nm.

As described above, this solid-state image sensor in accordance to at least one exemplary embodiment can include the anti-reflective structure placed on the light-receiving sections 102 and the additional anti-reflective structure 114 placed under the plasma SiN layer 109. Thus, this particular exemplary embodiment facilitates the reduction of the degree of color inconsistency and enhances the sensitivity to incident light with a desired wavelength.

Thus, in accordance with at least one exemplary embodiment, a film can be placed between a passivation layer and a color filter layer. The film can have a refractive index that is between the refractive index of the passivation layer and the refractive index of the color filter.

In a conventional in-layer lens, reflection occurring at a curved face thereof has little effect on interference. This is because since the distance between the curved face and a light-receiving face takes various values, phase shift causing interference does not occur. On the other hand, in an image sensor including a SiN passivation layer which can have a refractive index greater than that of other layers arranged therearound, reflection occurring at the SiN passivation layer is identical to reflection occurring at a color filter layer because the distance between a reflective face and a light-receiving face is constant. This can lead to the occurrence of interference, thereby causing color inconsistency. That is, the use of the SiN passivation layer can increase the color inconsistency as compared to that of the in-layer lens. When the SiN layer is placed between the two anti-reflective structures as described above in accordance with exemplary embodiments, the degree of improvement achieved thereby is about 30.

An additional component can be used for reducing the effect of color inconsistency. Thus, in accordance with at least one exemplary embodiment, an anti-reflective structure is placed on light-receiving sections.

Figure 4:
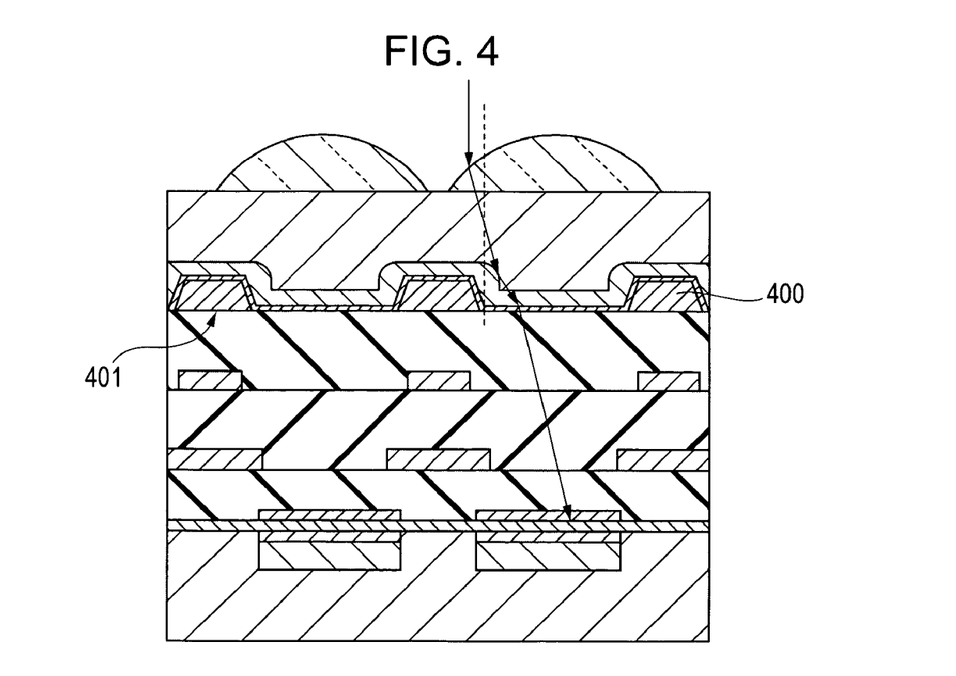
FIG. 4 illustrates a sectional view showing another type of solid-state image sensor.

In an exemplary embodiment, with reference to FIG. 4, an uppermost wiring layer 400 (a light-shielding layer) placed under a plasma SiN layer has trapezoidal portions. This configuration facilitates reducing the plasma SiN layer from refracting light in an unexpected direction. This configuration reduces the effective aperture area, due to a SiN layer.

The effect of this configuration is described with reference to FIG. 8. A light beam L1 passes through the microlenses 711 and the plasma SiN layer 709 overlying the steps of the uppermost third wiring layer 708 refracts the light beam L1 in an unexpected direction. That is, when the light beam L1 passing through the color filter 710, incident on the plasma SiN layer 709 which can have a large refractive index, the plasma SiN layer 709 refracts the light beam L1 outside. In this CMOS image sensor, an increase in the area of apertures causes color mixing and stray light. In order to reduce these effects, a light-shielding position is set on the lower face 401 of a light-shielding layer and maintained as designed. It is effective that the top areas of the apertures be greater than the bottom areas thereof because the top areas thereof have much effect on unexpected refraction. That is, the light-shielding layer has portions with a trapezoidal shape in cross section, or a wiring layer 400 has tapered end portions. An incident light beam can have a reduced refraction in an unexpected direction without shifting the light-shielding position unlike the light beam L1 shown in FIG. 4.

Figure 5:
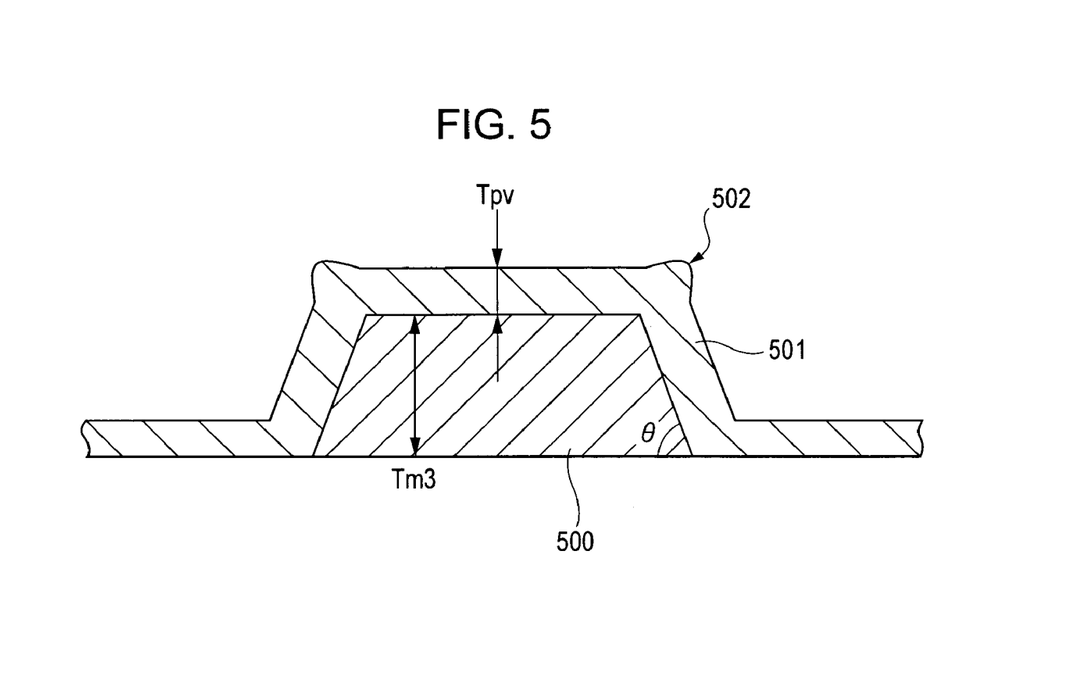
FIG. 5 illustrates a sectional view showing a wiring layer and a passivation layer placed thereon.

In at least one exemplary embodiment, the angle of the tapered end portions can be small. In order to reduce refraction, the angle, in at least one exemplary embodiment, can satisfy the inequality below in equation (1). FIG. 5 illustrates a sectional view showing the wiring layer 500 and a passivation layer 501.

Figure 6:
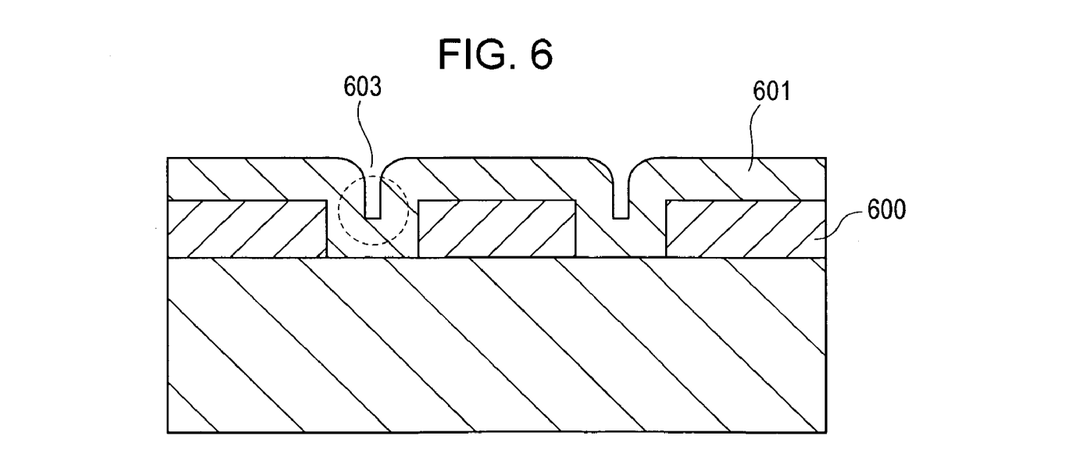
FIG. 6 illustrates a sectional view illustrating a problem caused by spaces present between wires.

Equation (1) represents an inequality relationship between certain thicknesses in at least one exemplary embodiment expressed as:

$$Tm3 > Tpv \times \tan\theta \qquad (1)$$

wherein Tpv represents the thickness of the passivation layer 501, Tm3 represents the thickness of the wiring layer 500 (the light-shielding layer), and θ represents the angle of the tapered end portions. In at least one exemplary embodiment, the angle θ can be from 70 to 85 degrees. When the passivation layer 501 is formed by depositing SiN on steps (e.g., by a plasma-enhanced CVD process), the passivation layer 501 can have overhanging portions 502 as shown in FIG. 5. In this configuration, when the uppermost layer (i.e., the passivation layer 501) has small spaces, hollows 603 remain in the uppermost layer 601 as shown in FIG. 6. A chemical solution remains in the hollows in a manufacturing step. This can lead to deterioration in the reliability. In order to avoid this problem, the spaces in the uppermost layer need to have a sufficient size. That is, when the passivation layer is made of SiN, the design rule needs to be enlarged.

However, the enlargement of the design rule becomes difficult because light-shielding layers included in CMOS image sensors are usually used as wiring layers. On the other hand, in at least one exemplary embodiment, the wiring layer can have tapered end portions, thus facilitating the use of the plasma SiN layer without changing the design rule.

To facilitate the plasma SiN layer having a protective function, the plasma SiN layer can have a thickness of 300 to 400 nm or more. To facilitate reduction of the dark current and 1/f noise, the plasma SiN layer can also be a larger thickness.

The wiring layer having the tapered end portions facilitates avoiding the refraction of light and can reduce dark current and 1/f noise since the plasma SiN layer can have a large thickness. At least a few exemplary embodiments will now be described in detail with reference to examples of exemplary embodiments.

EXAMPLE 1

Figure 7:
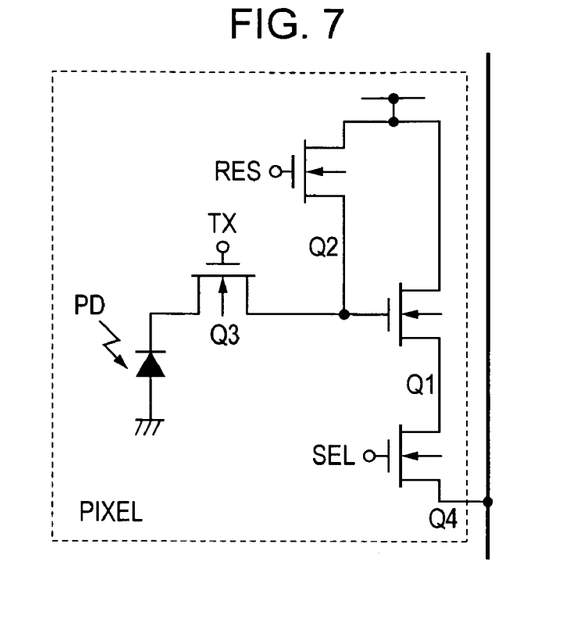
FIG. 7 illustrates a diagram showing an equivalent circuit of a unit pixel.

Example 1 is described below with reference to FIGS. 1 and 7. FIG. 1 illustrates a sectional view showing a solid-state image sensor of this example. FIG. 7 is a diagram showing an equivalent circuit of a unit pixel. The circuit includes a photodiode PD; a transfer switch Q3 for transferring a signal, transmitted from the photodiode PD, to a floating diffusion region; a source follower MOS Q1 for converting the signal charge of a voltage; a reset MOS Q4 for resetting the signal voltage; and a selection MOS Q2 for selecting a pixel. To facilitate reduction of the dark current, in at least one exemplary embodiment, the photodiode PD can be of an embedded type.

An anti-reflective structure for reducing the reflection of incident light from the surfaces of light-receiving sections 102 can be formed over the light-receiving sections 102. The anti-reflective structure includes a $SiO_2$ layer 112 which can have a thickness of about 2.5 nm and a SiN layer 113 which can have a thickness of 70 nm. The $SiO_2$ layer 112 can be placed directly over the light-receiving sections 102. The $SiO_2$ layer 112 can be over-etched so as to have such a thickness during the etching of a polysilicon layer for forming electrodes. SiN can be a material for forming the SiN layers 113, which can be deposited on the $SiO_2$ layer 112 (e.g., by a LP-CVD process). SiN can be formed by a thermal oxidation process or deposited by a CVD process after the polysilicon layer can be etched and a gate insulating layer can be then removed. SiN portions (for example, 400 nm) placed above the light-receiving sections 102 can be allowed to remain but the other SiN portions placed on other regions which can be removed. This is because the presence of remaining SiN leads to the complexity of a process for forming a contact hole for connecting a first wiring layer to a silicon layer or the polysilicon layer.

SiN portions placed on polysilicon regions other than the gate of the transfer switch Q3 shown in FIG. 7 can be removed. This is because hydrogen can hardly pass through the SiN portions formed by the LP-CVD process. Furthermore, this is because since a source of the dark current is the interface between a silicon substrate 101 and an oxide layer (e.g., 107) placed below polysilicon wires arranged on an isolation region (hereinafter referred to as LOCOS), the dark current created from the source can be reduced using a plasma SiN layer 109 formed in a subsequent step.

Subsequently, source-drain regions of MOS transistors can be formed using the polysilicon electrodes as a mask. A SiO$_2$ layer 103 can be formed on the source-drain regions and then planarized (e.g., by a CMP process), whereby a flat interlayer insulating layer can be formed. The interlayer insulating layer can be nonuniform in thickness when macroscopically observed. A second wiring layer 106 and then a third wiring layer 108 can be formed. The interlayer insulating layers (e.g., 103, 105, and 107) each placed between these wiring layers can be planarized in planarizing steps. The third wiring layer 108, the uppermost one, can be connected to a power supply, and can act as a light-shielding layer. A plasma SiN layer 109, acting as a passivation layer, which can have a thickness of 600 nm, can be formed on the third wiring layer 108 and then heat-treated at target temperature (e.g., 400° C.) for a target period of time (e.g., 120 minutes) in a target environment (e.g., one that includes hydrogen atmosphere). In at least one exemplary embodiment, the plasma SiN layer 109 can be heat-treated at up to 450° C. The dark current and 1/f noise can be greatly reduced due to the heat treatment. A color filter 110 can be formed on the plasma SiN layer 109 and the microlenses 111 formed on the color filter 110. The dark current and 1/f noise of this solid-state image sensor can be about 50% of those of a solid-state image sensor including no SiN passivation layer. The degree of color inconsistency of this solid-state image sensor can be about one third of that of a solid-state image sensor including no anti-reflective structure and can be substantially the same as that of a solid-state image sensor including a SiON passivation layer which can have a refractive index of 1.73.

EXAMPLE 2

FIG. 3 illustrates a schematic sectional view showing a solid-state image sensor of Example 2. This solid-state image sensor includes an additional anti-reflective structure 114 in addition to the same components as those of the solid-state image sensor of Example 1. The additional anti reflective structure 114 can be placed between a plasma SiN layer 109 and a third interlayer insulating layer 107 placed under a third wiring layer 108 which is the uppermost one; hence, little interface reflecting light is present between the plasma SiN layer 109 and the third interlayer insulating layer 107. The additional anti-reflective structure 114 can be made of SiON and can have a refractive index that can be between the refractive index of the plasma SiN layer 109 and the refractive index of the third interlayer insulating layer 107 made of SiO$_2$. In particular, the additional anti-reflective structure 114 can have a refractive index of about 1.73. Note, although specific materials are discussed in the examples discussed, the exemplary embodiments are not limited to the specific materials. The relative refractive indices of the layers can be achieved using various layers as known by one of ordinary skill in the relevant arts and equivalents (e.g., Si, SiN, SiC, and SiO$_2$) that also have the transmission and reflection properties of the layers discussed.

According to the solid-state image sensor of this example, since little interface reflecting light is present between the plasma SiN layer 109 and the third interlayer insulating layer 107, ripples can be reduced and the degree of color inconsistency can be also reduced.

EXAMPLE 3

A solid-state image sensor of Example 3 is different in configuration from the solid-state image sensor of Example 1 as described below. In particular, this solid-state image sensor includes an anti-reflective structure, placed on light-receiving sections, including a SiON layer 112 with a thickness of about 2.7 nm and SiN layers 113 with a thickness of about 70 nm. A method for manufacturing this solid-state image sensor is as described below. Note that although specific layer thicknesses are provided in the examples discussed, exemplary embodiments are not limited to any specific layer size, and other thicknesses as know by one of ordinary skill in the arts and equivalents are intended to lie within the scope of exemplary embodiments.

A polysilicon layer for forming electrodes can be etched and a gate insulating layer can then be removed. A SiON layer can be formed by CVD process, with subsequent steps the same as those described in Example 1.

According to this solid-state image sensor, when incident light has a wavelength of about 600 nm, the amount of reflected light is approximately 4% of the amount of the incident light. The degree of the color inconsistency of this solid-state image sensor is roughly one fifth or less of that of a conventional solid-state image sensor. The dark current and 1/f noise of this solid-state image sensor are substantially the same as those of the solid-state image sensor of Example 1. This is because the SiON layer 112 has a refractive index close to that of a silicon substrate 101.

EXAMPLE 4

A solid-state image sensor of Example 4 is different in configuration from the solid-state image sensor of Example 1 as described below. In particular, this solid-state image sensor includes an anti-reflective structure, placed on light-receiving sections, including a SiON layer 112 with a thickness of 6 nm and SiN layers 113 with a thickness of 45 nm. A SiO$_2$ layer with a thickness of 170 nm can be formed on the SiN layers 113 and a photoresist layer can be formed on the SiO$_2$ layer and partly removed such that portions of the photoresist layer remained above photodiodes, the portions having a perimeter of about 400 nm. The SiO$_2$ layer can be etched back, whereby sidewalls for LDD structures can be formed. That is, sidewalls of MOS transistors can be formed using the SiON layer 112 and the SiN layers 113. Since the LDD structures are formed in the step of forming the anti-reflective structure, this solid-state image sensor having good properties can be prepared without increasing the number of manufacturing steps. The solid-state image sensor of this example can have a high sensitivity to light with a wavelength of 550 nm or less.

EXAMPLE 5

A solid-state image sensor of Example 5 includes a SiON layer placed on a plasma SiN layer acting as a passivation layer in addition to the same components as those of the solid-state image sensor of Example 1. The SiON layer has a refractive index of about 1.66 and a thickness of about 100 nm. The plasma SiN layer has a thickness of about 400 nm. This solid-state image sensor includes a color filter, placed on the SiON layer, identical to that of the solid-state image sensor of Example 1. The amount of light reflected from the interface between the color filter and the SiON layer is small, this solid-state image sensor has high sensitivity to light with a wavelength of about 550 nm or less, and the degree of the color inconsistency of this solid-state image sensor is roughly one third or less of a conventional solid-state image sensor.

EXAMPLE 6

A solid-state image sensor of Example 6 includes anti-reflective layers in addition to the same components as those of the solid-state image sensor of Example 1. The anti-reflective layers are made of SiON and are each placed on or under a plasma SiN layer acting as a passivation layer. The lower anti-reflective layer has a refractive index of about 1.73 and the upper anti-reflective layer has a refractive index of about 1.66. The plasma SiN layer has a thickness of about 400 nm. Since the upper and lower anti-reflective layers have different refractive indexes, light reflection can be reduced from the interface between the plasma SiN layer and the upper or lower anti-reflective layer. Therefore, the degree of the color inconsistency of this solid-state image sensor is roughly one sixth or less of a conventional solid-state image sensor.

EXAMPLE 7

A solid-state image sensor of Example 7 includes micropixels and has high sensitivity. In a conventional solid-state image sensor including micropixels, as illustrated in FIG. 8, the effect of refraction of a plasma SiN, layer acting as a passivation layer, can be substantial. With reference to FIG. 3, this solid-state image sensor includes wiring layers. The uppermost one of the wiring layers has tapered end portions, acts as a light-shielding layer, and is connected to a power supply. The tapered end portions can have substantially a trapezoidal shape in cross section. The uppermost wiring layer has a thickness of about 800 nm and the tapered end portions have a taper angle of about 60 degrees. Therefore, the equation 800 nm×tan (90−θ)=460 nm holds, wherein θ is 60. Thus, the deterioration of sensitivity of this solid-state image sensor, due to refraction, can be reduced. In at least one exemplary embodiment, the plasma SiN layer has an anti-reflective structure, and/or only the tapered end portions.

EXAMPLE 8

A solid-state image sensor of Example 8, as well as the solid-state image sensor of Example 7, includes a wiring layer which is the uppermost one. The wiring layer has tapered end portions which can have a taper angle of about 70 degrees. Therefore, the equation 800 nm×tan (90−θ)=290 nm holds, wherein θ is 70. Thus, the sensitivity of this solid-state image sensor is reduced by about 6%. Since the tapered end portions of this solid-state image sensor have a larger taper angle as compared to the tapered end portions of the solid-state image sensor of Example 7, the minimum line width can be reduced to about 800 nm.

EXAMPLE 9

A solid-state image sensor of Example 9 has a configuration different from that of the solid-state image sensor of Example 7 or 8. This solid-state image sensor includes a plasma SiN layer acting as a passivation layer, a SiON layer with a refractive index of about 1.73, and a color filter, these layers and the filter being arranged in that order. Since this solid-state image sensor further includes anti-reflective structures each placed above or below the plasma SiN layer, color mixing can be reduced in this solid-state image sensor as compared to the solid-state image sensor of Example 7 or 8.

Second Exemplary Embodiment

A solid-state image sensor of the second exemplary embodiment includes an in-layer lens identical to the plasma SiN layer 109 included in the solid-state image sensor of the first exemplary embodiment. The term "in-layer lens" is defined as a lens structure located more close to a semiconductor substrate than the surface of a photoelectric conversion apparatus, i.e., the interface between the photoelectric conversion apparatus and air. In particular, the in-layer lens is a member, located directly above light-receiving sections and placed between interlayer insulating layers, which can have a light-gathering function.

In this exemplary embodiment, the expression "a wire or a layer is placed under or below a structure" means the wire or the layer is located close to a substrate and the expression "a wire or a layer is placed on or above a structure" means the wire or the layer is located far from a substrate. Solid-state image sensors of examples below each include three wiring layers. Exemplary embodiments are not limited to such a configuration and the number of wiring layers may be reduced or increased depending on the sensor structure.

EXAMPLE 10

Figure 10:
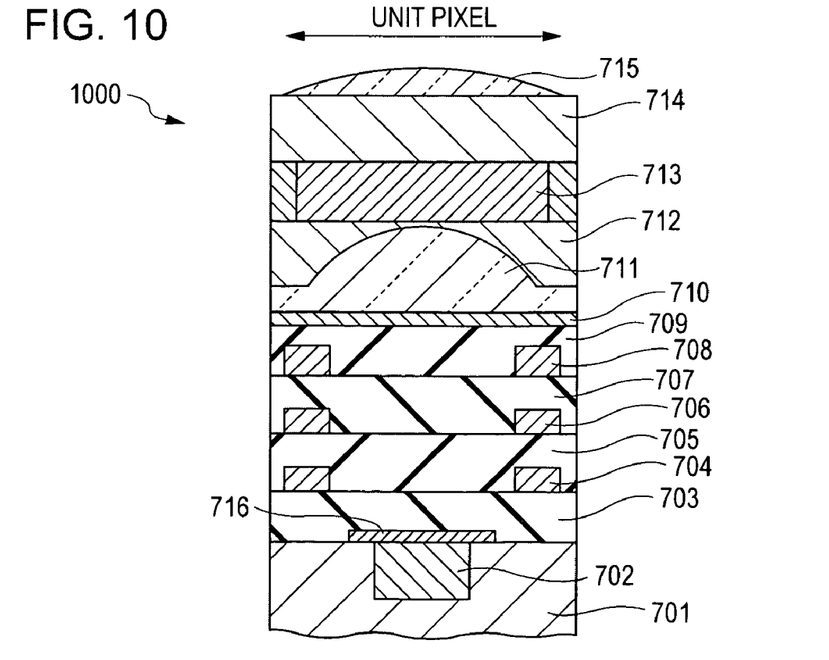
FIG. 10 illustrates a sectional view showing a unit pixel.

A solid-state image sensor of this example is described below with reference to FIG. 10. FIG. 10 illustrates a sectional view showing a unit pixel 1000. This solid-state image sensor includes a plasma SiN layer having lens-shaped portions unlike the solid-state image sensor of the first exemplary embodiment. In particular, this solid-state image sensor includes a silicon substrate 701, light-receiving sections 702 including photoelectric conversion apparatus, a first interlayer insulating layer 703, a second interlayer insulating layer 705, a third interlayer insulating layer 707, a fourth interlayer insulating layer 709, a first wiring layer 704, a second wiring layer 706, a third wiring layer 708, in-layer lenses 711 (e.g., made of SiN), a first anti-reflective layer 710 for reducing reflected light from the interfaces between the fourth interlayer insulating layer 709 and the in-layer lenses 711, a first planarized layer 712, a color filter 713, a second planarized layer 714, microlenses 715, and a second anti-reflective layer 716 for reducing reflected light from the interface between the first interlayer insulating layer 703 and the silicon substrate 701 and the interfaces between the first interlayer insulating layer 703 and the light-receiving sections 702.

The second anti-reflective layer 716 includes a SiO$_2$ sub-layer placed on the silicon substrate 701 and SiN sub-layers placed on the SiO$_2$ sub-layer. The SiO$_2$ sub-layer and the SiN sub-layers have a thickness of 5 to 100 nm. The second anti-reflective layer 716 facilitates the reduction of reflected light beams, i.e., interference components and also facilitates reducing changes in wavelength-transmittance properties. The second anti-reflective layer 716 can be different in configuration from the first anti-reflective layer 710. This is because the first anti-reflective layer 710 can have a function of reducing light, passing through the first anti-reflective layer 710 and then reflected from an interface present below the first anti-reflective layer 710, from being reflected. Light passing through the second anti-reflective layer 716 can be absorbed by the light-receiving sections 702 arranged in the silicon substrate 701 and then converted into electricity; hence, the second anti-reflective layer 716 need not have a function of reducing light, reflected from the silicon substrate 701 or a layer placed below the second anti-reflective layer 716, from being reflected. That is, the first anti-reflective layer 710 facilitates achieving good wavelength-transmittance properties; however, the second anti-reflective layer 716 need not have such a function and therefore has a configuration different from that of the first anti-reflective layer 710. Exemplary embodiments are not limited to these anti-reflective layers and any anti-reflective layer which can have an intermediate refractive index may be used, the intermediate refractive index being between the refractive indexes of layers between which the anti-reflective layer is placed.

The solid-state image sensor of this exemplary embodiment need not necessarily include the first anti-reflective layer 710 but may only include the second anti-reflective layer 716.

The examples described above may be used in combination.

Third Exemplary Embodiment

Figure 11:
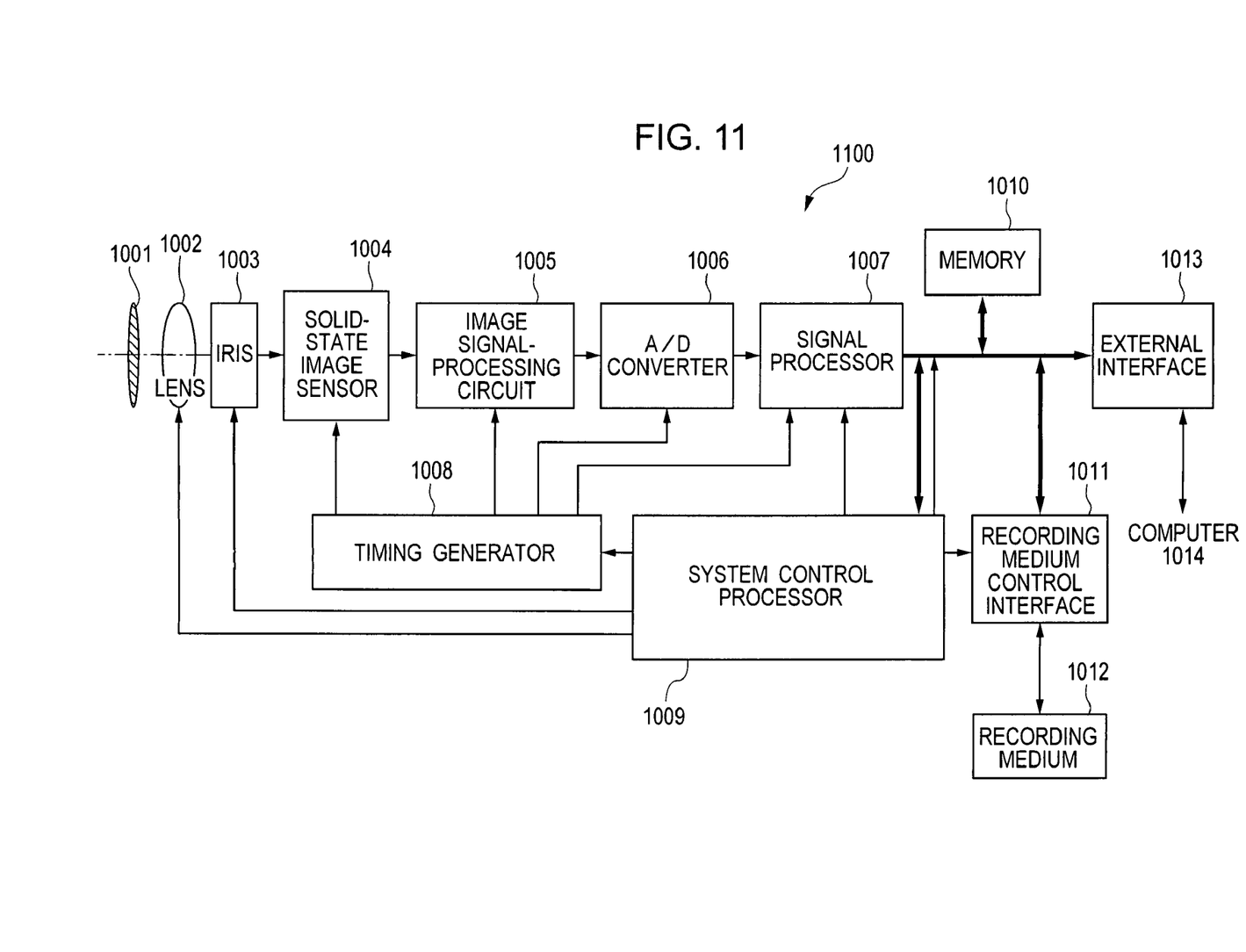
FIG. 11 illustrates a diagram showing an imaging system including a solid-state image sensor according to at least one exemplary embodiment.

A camera is an example of an imaging system including a solid-state image sensor according to any one of the above exemplary embodiments. Such a camera will now be described. FIG. 11 is a diagram of a circuit included in the camera. The camera includes a shutter 1001 configured to adjust exposure; a lens 1002 placed at the back of the shutter 1001; an iris 1003 configured to adjust the amount of light as required; a solid-state image sensor 1004 configured to detect an image; an image signal-processing circuit 1005 configured to process an image signal transmitted from the solid-state image sensor 1004; an A/D converter 1006 configured to convert an analog signal, transmitted from the image signal-processing circuit 1005, into a digital signal; a signal processor 1007 configured to process the digital signal transmitted from the A/D converter 1006; a timing generator 1008; a system control processor 1009 configured to control the camera system 1100; a memory 1010 configured to store the processed digital signal; and a recording medium control interface 1011 controlled by the system control processor 1009. The processed digital signal is stored in the memory 1010 or transmitted to external devices through an external interface 1013. The timing generator 1008 controls the solid-state image sensor 1004, the image signal-processing circuit 1005, the A/D converter 1006, and the signal processor 1007. In order to record image data on a recording medium 1012, the processed digital signal is transmitted to the recording medium 1012 through the recording medium control interface 1011.

Figure 12:
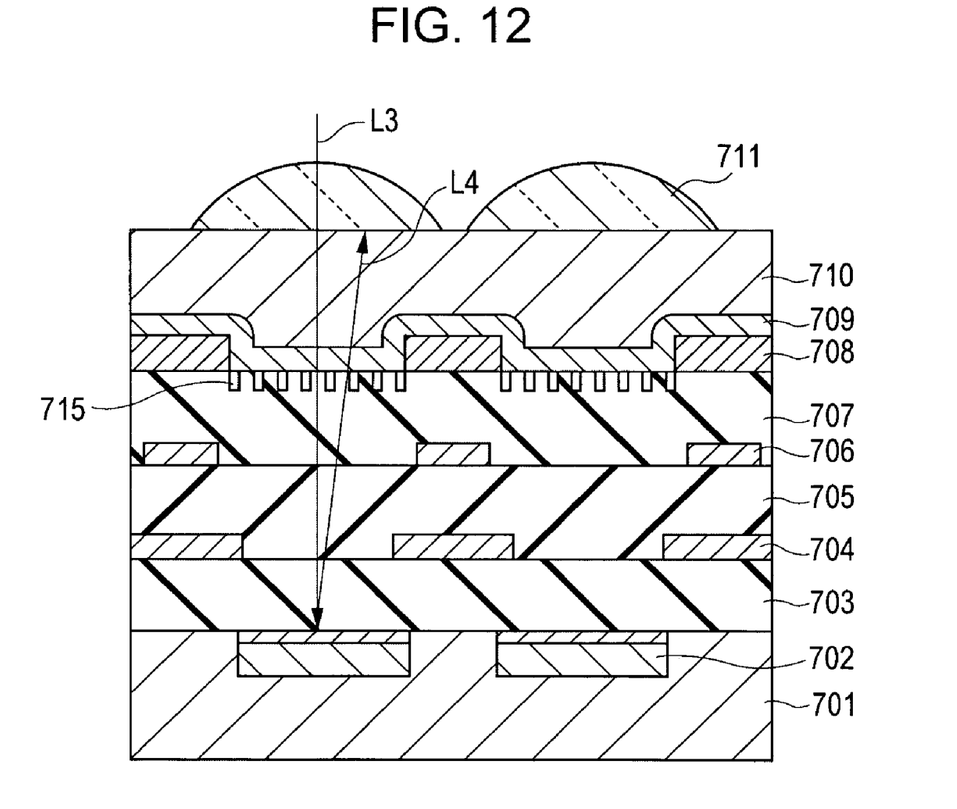
FIG. 12 illustrates another exemplary embodiment using regions of periodic structures.

In further exemplary embodiments similar to those discussed with reference to FIGS. 3 and 4 and as illustrated in FIG. 12, the antireflective structure 114 can be replaced with small periodic structures 715 (FIG. 12), where the width (horizontally on the page) is smaller than the target wavelength. For example, if the viewing wavelength is 680 nm, then a periodic structure of width on the order of 90 nm can be used. Various other widths, less than the target wavelength, can be used, in addition to other shapes besides the illustrated step shape, as known by one of ordinary skill in the relevant arts and equivalents. For example reflections L4 from incident light L3 off of layer 702, will be substantially transmitted (e.g., >95%) through the periodic structures 715, thus reducing interference at layer 702 due to reflections from the interface of layers 707 and 709. In at least one exemplary embodiment the periodic structures can be elements of differing refractive index, where the layer 707 has been etched and filled with a medium of different index of refraction than that of layer 707.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2004-257254 filed Sep. 3, 2004 and No. 2004-343357 filed Nov. 29, 2004, which are hereby incorporated by reference herein in their entirety.

What is claimed is:

1. A solid-state image sensor including a substrate, light-receiving sections placed on the substrate, a plurality of wiring layers, a plurality of interlayer insulating layers, and a first insulating layer, the wiring layers and the interlayer insulating layers being alternately arranged on the substrate, at least one of the wiring layers being placed on the first insulating layer, the solid-state image sensor comprising:

a second insulating layer which is placed on the wiring layer on the first insulating layer, which has portions in contact with the first insulating layer, the portions being located at the positions corresponding to the light-receiving sections, and which has a refractive index different from that of the first insulating layer;

a third insulating layer which is placed above the light-receiving sections and which reduces reflected light from the interface between the substrate and the interlayer insulating layer placed on the substrate; and a fourth insulating layer having a refractive index different from that of the second insulating layer and that of the first insulating layer, wherein the fourth insulating layer is placed between the first insulating layer and the second insulating layer, wherein the wiring layer on the first insulating layer is between the second insulating layer and the first insulating layer.

2. The sensor according to claim 1, wherein the first insulating layer is planarized.

3. The sensor according to claim 1, wherein the fourth insulating layer reduces the reflection of incident light from the interface between the first and second insulating layers.

4. The sensor according to claim 3, wherein the second insulating layer is made of silicon nitride and the fourth insulating layer is made of silicon oxynitride.

5. The sensor according to claim 4, wherein the fourth insulating layer has a thickness less than that of the wiring layer on the first insulating layer.

6. The sensor according to claim 1, wherein the third insulating layer includes a silicon oxide sub-layer and a silicon nitride sub-layer placed thereon.

7. The sensor according to claim 6, wherein the second insulating layer is made of silicon nitride, the fourth Insulating layer is made of silicon oxynitride, and the silicon oxide sub-layer has a thickness less than that of the fourth insulating layer.

8. The sensor according to claim 1, further comprising an optical element, wherein the optical element is one of a color filter or a microlens, wherein a film is placed between the optical element and the second insulating layer, and wherein the film has a refractive index that is between the refractive index of the second insulating layer and the refractive index of the optical element.

9. The sensor according to claim 8, wherein the film is made of silicon oxynitride.

10. The sensor according to claim 1, wherein the wiring layer on the first insulating layer has a tapered end portion.

11. The sensor according to claim 1, wherein the second insulating layer supplies hydrogen to the substrate.

12. The sensor according to claim 1, wherein the second insulating layer has lens-shaped portions.

13. A solid-state image sensor including a substrate, light-receiving sections placed on the substrate, a plurality of wiring layers, a plurality of interlayer insulating layers, and a substantially flat first insulating layer, the wiring layers and the interlayer insulating layers being alternately arranged on the substrate, at least one of the wiring layers being placed on the first insulating layer, the solid-state image sensor comprising:
   a silicon oxide layer;
   a plurality of silicon nitride layers having a first silicon nitride layer and a second silicon nitride layer; and
   a silicon oxynitride layer,
   wherein the silicon oxide layer and the first silicon nitride layer are placed above the light-receiving sections in that order from the light-receiving section side, and the second silicon nitride layer is placed on the wiring layer on the first insulating layer and has portions in contact with the first insulating layer with the silicon oxynitride layer placed therebetween, and the contact portions correspond to the light-receiving sections.

14. An imaging system comprising:
   the sensor according to claim 1;
   an optical system for transmitting light to the sensor; and
   a signal-processing circuit for processing a signal transmitted from the sensor.

15. The solid-state image sensor according to claim 1, further comprising:
   a region of periodic structures configured to reduce the reflection of incident light,
   wherein the region of periodic structures includes an array of periodic structure elements,
   wherein the periodic structure elements each have a width less than a target wavelength, and where the region is positioned between the second insulating layer and the first insulating layer.

16. A solid-state image sensor in which light-receiving sections are placed in a substrate, a plurality of wiring layers are provided above the substrate through interlayer insulating layers and a first insulating layer is placed on at least one of the wiring layers,
   wherein a silicon oxide layer and a first silicon nitride layer are placed on at least a part of the light-receiving section in this order from the light-receiving section side, and
   wherein a silicon oxynitride layer and a second silicon nitride layer are placed in this order on the first insulating layer at a position corresponding to the light-receiving section.

17. A solid-state image sensor according to claim 16, wherein a wiring layer is further placed between the first insulating layer and the silicon oxynitride layer.

18. A solid-state image sensor according to claim 16, wherein the silicon oxide layer and the first silicon nitride layer placed on the light-receiving section reduce reflected light from the interface between the substrate and the interlayer insulating layer, and
   wherein the silicon oxynitride layer placed on the first insulating layer reduces reflected light from the interface between the second silicon nitride layer and the first insulating layer.

19. A solid-state image sensor in which light-receiving sections are placed in a substrate, a plurality of wiring layers are provided above the substrate through interlayer insulating layers and a first insulating layer is placed on at least one of the wiring layers, the solid-state image sensor comprising:
   a second insulating layer which is placed on the first insulating layer and which has a refractive index different from that of the first insulating layer;
   a third insulating layer which is placed above at least a part of the light-receiving section and which reduces reflected light from the interface between the substrate and the interlayer insulating layer; and
   a fourth insulating layer which is placed between the first insulating layer and the second insulating layer and which reduces reflected light from the interface between the first insulating layer and the second insulating layer.

20. A solid-state image sensor according to claim 19, wherein a wiring layer is further placed between the first insulating layer and the fourth insulating layer.

* * * * *